United States Patent
Liang et al.

(10) Patent No.: US 10,676,646 B2
(45) Date of Patent: Jun. 9, 2020

(54) CHEMICAL MECHANICAL POLISHING SLURRY FOR COBALT APPLICATIONS

(71) Applicant: FUJIFILM Planar Solutions, LLC, Mesa, AZ (US)

(72) Inventors: Yannan Liang, Gilbert, AZ (US); Liqing Wen, Mesa, AZ (US); Bin Hu, Chandler, AZ (US); Hyosang Lee, Chandler, AZ (US); Shu-Wei Chang, Taoyuan (TW); Sung Tsai Lin, Taoyuan (TW)

(73) Assignee: FUJIFILM ELECTRONIC MATERIALS U.S.A., INC., North Kingston, RI (US)

( * ) Notice: Subject to any disclaimer, the term of this patent is extended or adjusted under 35 U.S.C. 154(b) by 0 days.

(21) Appl. No.: 15/984,960

(22) Filed: May 21, 2018

(65) Prior Publication Data

US 2018/0340094 A1 Nov. 29, 2018

Related U.S. Application Data

(60) Provisional application No. 62/511,065, filed on May 25, 2017.

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 10,059,860 B2 | 8/2018 | Yasui | |
| 2006/0283095 A1* | 12/2006 | Mahulikar | C01B 33/14 51/308 |
| 2009/0215269 A1 | 8/2009 | Boggs et al. | |
| 2009/0311864 A1* | 12/2009 | Yamada | C09G 1/02 438/693 |
| 2013/0140273 A1 | 6/2013 | Lu et al. | |
| 2014/0011361 A1* | 1/2014 | Reichardt | C09G 1/02 438/693 |

(Continued)

FOREIGN PATENT DOCUMENTS

| CN | 10568336 A | 6/2006 |
|---|---|---|
| CN | 105295737 A | 2/2016 |

(Continued)

OTHER PUBLICATIONS

International Search Report dated Aug. 13, 2018 for PCT application No. PCT/US2018/33660.

(Continued)

*Primary Examiner* — Allan W. Olsen
(74) *Attorney, Agent, or Firm* — Ohlandt, Greeley, Ruggiero & Perle, LLP

(57) ABSTRACT

A slurry that polishes surfaces or substrates which includes cobalt. The slurry further comprises an anionic and/or cationic surfactant, each of which has a phosphate group, a long chain alkyl group, or both. The slurry also includes a corrosion inhibitor, abrasives, removal rate enhancers, solvents, pH adjustors, and chelating agents. The pH of the slurry is preferably 8 or higher.

17 Claims, 7 Drawing Sheets

| Slurry | TEOS RR (A/min) | SiN RR (A/min) | TiN RR (A/min) | Ti RR (A/min) | Co RR (A/min) |
|---|---|---|---|---|---|
| A3X, 24nm | 66 | 33 | 240 | 48 | 36 |
| A3X, 40nm | 227 | 89 | 507 | 321 | 22 |
| A3X, 50nm | 259 | 112 | 798 | 480 | 25 |
| A3X, 70nm | 271 | 133 | 858 | 606 | 18 |
| A3X, 130nm | 242 | 90 | 399 | 177 | 40 |

(56) References Cited

U.S. PATENT DOCUMENTS

| | | | |
|---|---|---|---|
| 2015/0284593 A1* | 10/2015 | Wang | C09G 1/02 438/693 |
| 2016/0027657 A1* | 1/2016 | Shi | C09G 1/02 438/693 |
| 2016/0053136 A1* | 2/2016 | McDonough | H01L 21/3212 438/692 |
| 2016/0068710 A1 | 3/2016 | Wang et al. | |
| 2016/0108286 A1 | 4/2016 | Sikma et al. | |
| 2016/0115353 A1 | 4/2016 | Kraft et al. | |
| 2016/0130500 A1 | 5/2016 | Chen et al. | |
| 2016/0314989 A1* | 10/2016 | Shi | C09K 3/1463 |
| 2017/0154787 A1* | 6/2017 | Sakashita | B24B 37/00 |
| 2017/0362466 A1* | 12/2017 | Shi | B24B 37/044 |

FOREIGN PATENT DOCUMENTS

| | | |
|---|---|---|
| TW | 201540817 A | 11/2015 |
| WO | 2016065067 A | 4/2016 |
| WO | 2016068182 A1 | 5/2016 |
| WO | 2016111990 A1 | 7/2016 |
| WO | 2016140246 A1 | 9/2016 |

OTHER PUBLICATIONS

Written Opinion dated Aug. 13, 2018 for PCT application No. PCT/US2018/33660.
Taiwan Search Report dated Mar. 27, 2019 for Taiwan patent application No. 107117745.
International Preliminary Report on Patentability dated Dec. 5, 2019 for PCT application No. PCT/US2018/33660.
Chinese Office Action dated Mar. 4, 2020 for Chinese application No. 201810516084.2.

\* cited by examiner

| Slurry | 9x1 μm Dishing (A) | 5x1 μm Dishing (A) | 1.5x0.5 μm Dishing (A) | 1x1 μm Dishing (A) | 0.25x0.25 μm Dishing (A) |
|---|---|---|---|---|---|
| CE | -262 | -251 | -223 | -211 | -142 |
| A3X, 70nm | -144 | -144 | -119 | -74 | -61 |
| A3X, 50nm | -155 | -136 | -127 | -116 | -83 |
| A3X, 40nm | -77 | -74 | -48 | -78 | -54 |

Figure 1

| Slurry | CE | A3X 10× CA-3 | A3X 6× CA-3 | A3X 2× CA-3 |
|---|---|---|---|---|
| SER (A/min) | 15.4 | 2.6 | 1.1 | 0.6 |

Figure 2

| Slurry | A3X; 0× Co Cl | A3X; 0.25× Co Cl | A3X; 0.5× Co Cl | A3X; 0.65× Co Cl | A3X; 0.8× Co Cl | A3X; 1× Co Cl |
|---|---|---|---|---|---|---|
| SER (A/min) | 22.8 | 5.1 | 3.3 | 3.1 | 2.1 | 2.8 |

Figure 3

| Slurry | TEOS RR (A/min) | SiN RR (A/min) | TiN RR (A/min) | Ti RR (A/min) | Co RR (A/min) |
|---|---|---|---|---|---|
| A3X, 24nm | 66 | 33 | 240 | 48 | 36 |
| A3X, 40nm | 227 | 89 | 507 | 321 | 22 |
| A3X, 50nm | 259 | 112 | 798 | 480 | 25 |
| A3X, 70nm | 271 | 133 | 858 | 606 | 18 |
| A3X, 130nm | 242 | 90 | 399 | 177 | 40 |

Figure 4

| Slurry | TEOS RR (A/min) | Co RR (A/min) | SiN RR (A/min) |
|---|---|---|---|
| A3X, 0.5x Co Cl, 2x RRE | 157 | 539 | 68 |
| A3X, 0.5x Co Cl, 4x RRE | 168 | 1198 | 80 |
| A3X, 0.5x Co Cl, 6x RRE | 172 | 1401 | 81 |
| A3X, 0.5x Co Cl, 8x RRE | 187 | 1751 | 87 |
| A3X, 0.5x Co Cl, 10x RRE | 202 | 1972 | 88 |
| A3X | 183 | 20 | 82 |

Figure 6

| Slurry | TEOS RR (A/min) | Ti RR (A/min) | TiN RR (A/min) | Co RR (A/min) |
|---|---|---|---|---|
| A3X, 3x Co Cl | 181 | 255 | 480 | 21 |
| A3X, 6x Co Cl | 188 | 312 | 519 | 0 |
| A3X, 9x Co Cl | 177 | 384 | 525 | 11 |
| A3X, 12x Co Cl | 190 | 294 | 465 | 20 |

Figure 7

| Slurry | TEOS RR (A/min) | Co RR (A/min) |
|---|---|---|
| A3X, 3x Co Cl | 170 | 23 |
| A3X, 2x Co Cl | 187 | 75 |
| A3X, 1x Co Cl | 193 | 138 |
| A3X, 0.85x Co Cl | 204 | 1106 |
| A3X, 0.5x Co Cl | 180 | 1776 |

Figure 8

CHEMICAL MECHANICAL POLISHING SLURRY FOR COBALT APPLICATIONS

CROSS-REFERENCE TO RELATED APPLICATIONS

The present application claims the benefit of U.S. Provisional Patent Application Ser. No. 62/511,065, filed on May 25, 2017, which is herein incorporated by reference.

BACKGROUND OF THE DISCLOSURE

1. Field of the Disclosure

The present disclosure provides a concentrate and point-of-use polishing slurry that is advantageous for polishing cobalt materials. In particular, the concentrates and slurries of the present disclosure comprise, in part, a synergistic combination of a high-purity abrasive, an anionic surfactant with a phosphate group and/or a long alkyl chain, and a benzotriazole derivative.

2. Description of the Related Art

Cobalt has seen increasing use in the chemical-mechanical polishing (CMP) industry in recent years, as a new material for scaling down chips. Previously, copper and tungsten were used in places where cobalt is used now. Cobalt sticks very well, has homogeneous deposition properties, has low resistance/good conductance, and good gap fill. Thus, it is being used in several chip layers in the place of tungsten and/or copper, in some current and many future chip manufacturing designs. Commercial products containing cobalt will be showing up in chips in the latter part of 2017 and very broadly in 2018.

Cobalt is a mechanically hard but chemically fragile material. For example, cobalt has a Mohs Hardness of 5, where copper has a Mohs Hardness of 3. (The higher the Mohs Hardness, the harder the material—diamond has a Mohs Hardness of 10.) However, cobalt is chemically very fragile and delicate, and this is a major issue that the semiconductor industry has been facing. Cobalt films are chemically reactive and very susceptible to chemical corrosion. Cobalt corrosion oxidizes the cobalt film to a higher oxidation state. Post polishing, if the corrosion does not stop, the film continues to be etched and corroded. Thus, upon completion of the circuitry and wiring in the chip, the corroded areas leak electrons, causing the devices to fail.

Many currently available CMP slurries are designed to remove materials more common in older chip designs, such as the aforementioned copper and tungsten. Certain components in these older CMP slurries may cause deleterious and unacceptable defects in cobalt, since cobalt is more susceptible to chemical corrosion. As a result, when using copper polishing slurries on cobalt layers, unacceptable corrosion, wafer topography, and removal rate selectivity occur. Accordingly, there is a need for a new CMP slurry that optimizes removal of desired materials and still protects cobalt.

SUMMARY OF THE DISCLOSURE

In one embodiment, the present disclosure provides a polishing slurry concentrate for use on cobalt substrates, comprising: at least one surfactant selected from the group consisting of: an anionic surfactant, a cationic surfactant, and a combination thereof; at least one azole selected from the group consisting of: a benzotriazole, a benzotriazole derivative, and a combination thereof; a solvent; a removal rate enhancer; an abrasive; a pH adjustor that is a base; and a chelating agent. In one embodiment, the anionic surfactant is present, and comprises one or more phosphate groups, and one or more of the following: long alkyl chains, multiple ethylene oxide groups, and a combination of a long alkyl chain and multiple ethylene oxide groups.

In another embodiment, the present disclosure provides a point-of-use polishing slurry for use on cobalt substrates, comprising the above-described polishing slurry concentrate, water, and an oxidizer. The surfactant is present in an amount of 5 ppm to 1000 ppm, based on the total weight of the slurry, the benzotriazole, benzotriazole, or combination thereof is present in an amount of 10 ppm to 0.5%, based on the total weight of the slurry, the solvent is present in an amount of 25 ppm to 2.0%, based on the total weight of the slurry, the removal rate enhancer is present in an amount of 0.01% to 2.5%, based on the total weight of the slurry, the abrasive is present in an amount of 1% to 12%, based on the total weight of the slurry, the pH adjustor is present in an amount of 0.1% to 10%, based on the total weight of the slurry, the chelating agent is present in an amount of 0.05% to 2.5%, based on the total weight of the slurry, and the oxidizer is present in an amount of 500 ppm to about 5%, based on the total weight of the POU slurry.

The present disclosure also provides methods for polishing a substrate that at least partially comprises cobalt. In one method, the concentrate is diluted to form a point of use slurry, and then the substrate is contacted with the point of use slurry. Another method comprises the step of contacting the substrate with the slurry.

As used in the present disclosure, a "concentrate" is a composition that includes higher amounts of the components than would be used at the point-of-use (POU), i.e. the point at which the composition contacts the wafer to be polished. A user may take the concentrate and dilute it with other ingredients (such as water, or an oxidizer such as hydrogen peroxide), so that the POU slurry ultimately has lower weight percentages of the components than were in the slurry.

BRIEF DESCRIPTION OF THE DRAWINGS

FIG. 1 shows a plot of dishing defects, comparing a prior art slurry to that of the present disclosure.

FIGS. 2 and 3 show tables of data for static etch rates on a cobalt wafer coupon, comparing the prior art slurry and several slurries according to the present disclosure.

FIG. 4 shows a plot of removal rates for slurries of the present disclosure, with varying abrasive particle sizes.

FIG. 6 shows a plot of removal rates of various wafer materials by the slurries of the present disclosure, with varying amounts of chelating agent.

FIGS. 7 and 8 show plots of removal rates of various wafer materials by the slurries of the present disclosure, with varying amounts of cobalt corrosion inhibitor.

DETAILED DESCRIPTION OF THE DISCLOSURE

Figure 5A:
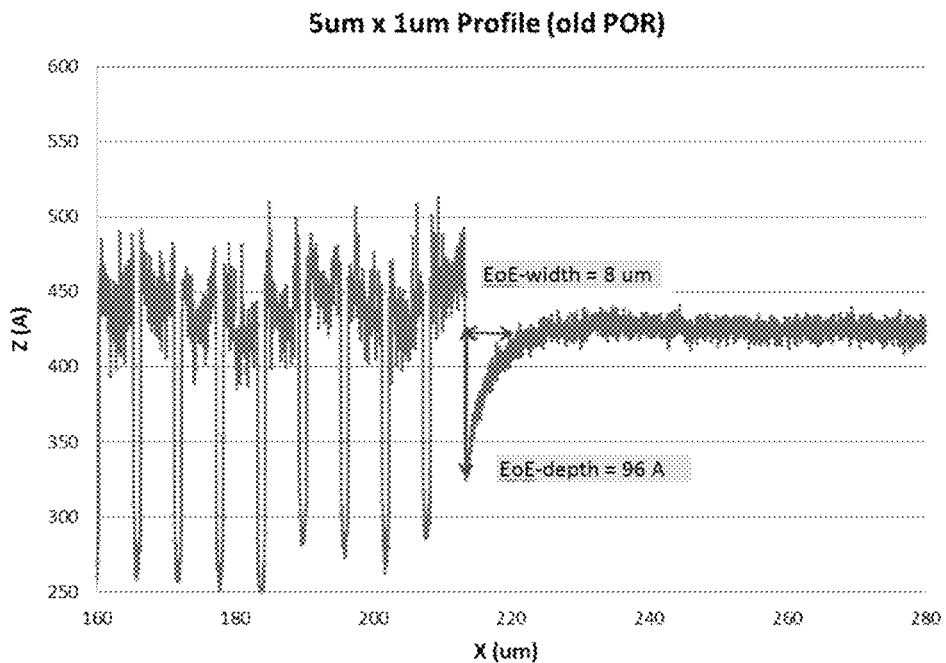
FIGS. 5a and 5b show edge of erosion data for a prior art slurry and that of the present disclosure, respectively.

The present disclosure provides a CMP concentrate and POU slurry that addresses the deficiencies of currently available products, particularly with respect to polishing cobalt materials. Advantageously, the present disclosure provides a combination of an anionic surfactant and benzotriazole derivative, which work synergistically or particularly well with selected abrasives and cobalt removal rate enhancers (RREs), to polish common wafer materials at high rates, while still protecting cobalt. For example, the concentrates and slurries of the present disclosure provide desirable removal rates for the common wafer material tetra-ethyl-ortho-silicate (TEOS), while still providing low removal and/or protection of cobalt.

The anionic surfactant serves as a corrosion inhibitor for cobalt. It can be a compound with one or more phosphate groups. In addition to the phosphate group, the anionic surfactant has one or more long alkyl chains multiple ethylene oxide groups, or a combination of the two. There can also be one or more alkyl chains or multiple ethylene oxide groups per phosphate group. In one embodiment, the alkyl chain can have from six to twenty-four carbons. In another embodiment, the alkyl chain can have from eighteen to twenty carbons. Without being bound by theory, it is believed that the long alkyl chain makes the compound hydrophobic, and protects the cobalt surfaces. In copper CMP slurries, the corrosion inhibitor is often a cyclic compound, such as benzotriazole or 1, 2, 4, triazole, and thus offered less protection.

Suitable compounds for the anionic surfactant include, but are not limited to, those with a phosphate group and long alkyl chain, sarcosinates with a long hydrocarbon chain containing a double bond, sarcosinates with a long hydrocarbon chain, amino acids with hydrocarbon chain, such as glycine, arginine, glutamic acid, or alanine, sulfonates with dialkyl chains, sulfonates with a hydrocarbon chain, lanolinic fatty acids, glycoside with a hydrocarbon chain, and any combinations thereof. Some cationic surfactants may also work well in the present compositions, such as an aminoalkyl siloxane, an imidazole with a long alkyl chain, an ammonium with hydrocarbon chains, a polymer-based ammonium, and any combinations thereof. The cationic surfactants may be used in place of or in conjunction with the anionic surfactants. The anionic and/or cationic surfactants may be present in an amount of 5 parts per million (ppm) to 1000 ppm, based on the total weight of the POU slurry, and any subranges thereof. The anionic and/or cationic surfactants may also be present in an amount of 5 parts per million (ppm) to 100 ppm, based on the total weight of the POU slurry, and any subranges thereof.

When the surfactants described above are used, the compositions of the present disclosure may also comprise an azole selected from the group consisting of benzotriazole (BTA), a BTA derivative, and a combination thereof. The BTA derivative may be selected from the group consisting of adenine, benzimidazole, thiabendazole, tolyltriazole, 1,2,3-triazole, 1,2,4-triazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-Amino-4H-1,2,4-triazole, 5-methylbenzotriazole, 5-chlorobenzotriazole, 5-aminotetrazole, and combinations thereof. The BTA and/or BTA derivative can be present in an amount of 10 ppm to 0.5%, or any subranges thereof. The BTA and/or BTA derivative can be present in an amount of 10 ppm to 800 ppm, based on the total weight of the POU slurry, or any subranges thereof.

A solvent may be used in the POU slurries of the present disclosure, which can help with the dissolution of the BTA derivative. The solvent may be one or more alkylene glycols. In one embodiment, the solvent comprises one or more solvents selected from the group consisting of ethanol, 1-propanol, 2-propanol, n-butanol, propylene glycol, 2-methoxyethanol, 2-ethoxyethanol, propylene glycol propyl ether, and ethylene glycol. The solvent can be present in an amount of 25 ppm to 2%, based on the total weight of the POU slurry, or any subranges thereof. The solvent may also be present in an amount of 50 ppm to 0.5%, based on the total weight of the POU slurry, or any subranges thereof.

The compositions of the present disclosure also include a removal rate enhancer (RRE), which can be selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, bicine, phosphoric acid, diglycolic acid, glyceric acid, tricine, alanine, histidine, valine, phenylalanine, proline, glutamine, aspartic acid, glutamic acid, arginine, lysine, tyrosine, benzoic acid, mixtures thereof, and salts thereof. The RRE can be present in an amount of 0.01% to 2.5%, based on the total weight of the POU slurry, or any subranges thereof. The RRE can also be present in an amount of 0.01% to 0.5%, based on the total weight of the POU slurry, or any subranges thereof.

The compositions of the present disclosure also include an abrasive. The abrasive can be selected from the group consisting of alumina, silica, titania, ceria, zirconia, co-formed products thereof, or mixtures thereof, and may also be anionic, cationic, nonionic, and any combinations thereof. In one embodiment, the abrasive is high-purity, and can have less than 100 ppm of alcohol, less than 100 ppm of ammonia, and less than 100 parts per billion (ppb) of an alkali such as sodium. The abrasive can be present in an amount of 1% to 12%, based on the total weight of the POU slurry, or any subranges thereof. The abrasive can also be present in an amount of 2% to 8%, based on the total weight of the POU slurry, or any subranges thereof.

The size of the abrasives can be between sixteen nanometers and one hundred eighty nanometers, or any subranges therebetween. The size of the abrasives can also be between twenty-four nanometers and one hundred thirty nanometers, or any subranges therebetween. The size of the abrasives can also be between forty nanometers and seventy nanometers, or any subranges therebetween. As discussed in greater detail below, in general, the larger the particles, the higher the removal rate of the wafer materials. However, when the size of the particles gets too high, such as greater than one hundred thirty nanometers, the removal rate can drop off. It is believed that this happens because larger particles mean less overall available abrasive surface area and a lower number of individual abrasive particles.

The compositions can also include a base acting as a pH adjustor. The base pH adjustor helps in taking the composition pH to its operating pH value. The base used to adjust the pH can be any suitable base, such as ammonium hydroxide, sodium hydroxide, potassium hydroxide, cesium hydroxide, monoethanol amine, diethanol amine, triethanol amine, tetrabutyl ammonium hydroxide, tetrapropylammonium hydroxide, tetraethyl ammonium hydroxide tetramethyl ammonium hydroxide, ethyltrimethylammonium hydroxide, diethyldimethylammonium hydroxide, dimethyldipropylammonium hydroxide, benzyltrimethylammonium hydroxide, or any combinations thereof. The pH adjustor can be present in an amount of 0.1% to 10%, based on the total weight of the POU slurry, or any subranges thereof. In one embodiment, the pH adjustor comprises potassium hydroxide. The pH adjustor can also be present in an amount of 0.2% to 0.5%, based on the total weight of the POU slurry, or any subranges thereof. The pH of the POU slurry should be alkaline, and the pH adjustor can help achieve the desired pH. Preferably, the pH of the concentrate and POU slurry is greater than 8.0, or more preferably, 9.0 or higher.

The compositions of the present disclosure also comprise a chelating agent. The chelating agent provides an anion source that bonds to metals, and enhances the removal rate of the polished metals. The metals on which such agents may work are titanium, tantalum, and cobalt, alone or in compounds with other elements. The chelating agent can be any molecule containing multiple carboxylic or amino acids, or the combination of both functional groups. Some examples are ethylenediaminetetracetic acid (EDTA), iminodiacetic acid (IDA), N-hydroxyethyl-ethylenediaminetriacetic acid (NHEDTA), nitrilotriacetic acid (NTA), diethylenetriaminepentacetic acid (DTPA), hydroxyethylethylenediaminetriacetic acid (HEDTA), triethylenetetraaminehexaacetic acid (TTHA), propionic acid, citric acid, malonic acid, maleic acid, tartaric acid, glycolic acid, lactic acid, malic acid, oxalic acid, succinic acid, glycine, alanine, serine, or combinations thereof. The concentration of the chelating agent can be from 0.05% to 2.5%, based on the total weight of the POU slurry, or any subranges thereof. The concentration of the chelating agent can also be from 0.05% to 0.15%, based on the total weight of the POU slurry, or any subranges thereof.

The above-recited amounts of each of the individual components relate to the POU slurry. The present disclosure contemplates that the above-recited components can be combined, packaged, and stored in a concentrate, which is then diluted with water and optional additional ingredients to form the POU slurry. The concentrate can be diluted at least two (2×) or three (3×) times. The weight percentages of each component in the concentrate would be proportional to what is listed above. For example, with a concentrate that is to be diluted 2×, the concentrate has twice the amount of each component as the POU slurry. This means that the anionic surfactant would be present in an amount of 10 ppm to 2000 ppm, based on the total weight of the concentrate, and any subranges thereof. The BTA and/or BTA derivative would be present in an amount of 20 ppm to 1%, based on the total weight of the concentrate, and any subranges thereof. The solvent would be present in an amount of 50 ppm to 4%, based on the total weight of the concentrate, and any subranges thereof. The RRE would be present in an amount of 0.02% to 5%, based on the total weight of the concentrate, or any subranges thereof. The abrasive would be present in an amount of 2% to 24%, based on the total weight of the concentrate, or any subranges thereof. The pH adjustor would be present in an amount of be present in an amount of 0.2% to 20%, based on the total weight of the concentrate, or any subranges thereof. The concentration of the chelating agent would be from 0.10% to 5%, based on the total weight of the concentrate, or any subranges thereof. For concentrations that are to be diluted to other ratios, for example 3× and higher, the amount of each ingredient in the concentrate would be adjusted in a similar fashion. A 3× concentrate, such as the one described in greater detail below, has three times the amount of each of the ingredients described above with respect to the POU slurry.

An oxidizer can be added when diluting the concentrate to form the POU slurry. The oxidizer can be selected form the group consisting of hydrogen peroxide, ammonium persulfate, silver nitrate (AgNO3), ferric nitrates or chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, potassium permanganate, other inorganic or organic peroxides, and mixtures thereof. In one embodiment, the oxidizer is hydrogen peroxide. The oxidizer can be present in an amount of about 500 ppm to about 5%, based on the total weight of the POU slurry, or from about 0.4% to about 2%, based on the total weight of the POU slurry, and any subranges therebetween.

The present disclosure also contemplates a method of using any of the above-described concentrates or POU slurries. With the concentrate, the method may comprise the steps of diluting the concentrate to form the POU slurry, and then contacting a surface at least partially comprising cobalt with the POU slurry. With the POU slurry, the method comprises the step of contacting the surface at least partially comprising cobalt with the slurry.

Some of the advantages of the concentrate and POU slurry of the present disclosure are shown in the accompanying Figures. Except as otherwise noted, the following Figures compare a prior art, comparative example POU slurry, with the POU slurries of the present disclosure.

The composition of the prior art slurry (CE) is as follows:

| | |
|---|---|
| Base | 0.1-10 wt % |
| Organic acid-1 | 0.05-2.5 wt % |
| Amino Acid | 0.01-1 wt % |
| Azole corrosion inhibitor-1 | 0.001-0.5 wt % |
| Organic acid-2 | 0.01-1 wt % |
| Azole corrosion inhibitor-2 | 0.001-0.5 wt % |
| Colloidal silica abrasive | 1-12 wt % |
| Oxidizer | 0.5-5 wt % |
| DI water | 80-90 wt % |
| pH | 8.0-10.5 |

A POU slurry according to the present disclosure was tested, with a concentrate that was diluted 3× to form the POU. The concentrate that was used is denoted herein as A3×. Water and an oxidizer were added when diluting the A3× concentrate to form the POU slurry. The composition of A3× is as follows:

The composition of A3× is as follows:

| | |
|---|---|
| Base | 0.1-10 wt % |
| Organic acid | 0.05-2.5 wt % |
| Ionic surfactant corrosion inhibitor | 0.0005-0.1 wt % |
| Amino acid | 0.01-2.5 wt % |
| Azole corrosion inhibitor | 0.001-0.5 wt % |
| Organic solvent | 0.0025-2 wt % |
| Colloidal silica abrasive | 1-12 wt % |
| Oxidizer | 0.5-5 wt % |
| DI water | 80-95 wt % |
| pH | 8.0-10.5 |

FIG. 1 shows a plot of dishing defects using the prior art slurry CE, and the present POU slurry based on A3×, with varying particle sizes of the abrasives. Dishing refers to a defect whereby a particular area of the wafer has an undesired depression in the surface. For the data in FIG. 1, a 200-millimeter wafer was polished with a Mirra machine and an H804 polishing pad. FIG. 1 shows the counts of dishing defects of various sizes, from 9×1 micrometer down to 0.25×0.25 micrometers. As can be seen in the plot, with the prior art slurry CE, the defects produced are very deep, up to 250 Angstroms. With the slurry A3× of the present disclosure, the sizes of the dishing defects are drastically reduced, by 100 Angstroms or more. The smaller the size of the abrasives, the smaller the dishing defect.

FIGS. 2 and 3 measure the static etch rate (SER) of the prior art slurry CE and the slurries of the present disclosure, on a coupon of cobalt material. The static etch rate measures how much material is removed by the slurry alone, without any external pressure from a polishing tool. In this case, a higher static etch rate of cobalt is undesirable. The slurries were applied to the coupon at sixty degrees Celsius for five minutes.

As shown in FIG. 2, the static etch rate of the slurry CE was very high, at 15.4 Angstroms/minute. By contrast, all of the A3×slurries that included the anionic surfactant (referred to in FIG. 3 as cobalt corrosion inhibitor, or "Co CI"), were much, much lower, at most 5.1 Angstroms/minute. FIG. 2 shows the effect of varying the amount of Co RRE. At high amounts of Co RRE, ten times what is shown in the chart for A3×above, the static etch rate was 2.6 Angstroms/minute, and at twice the amount of Co RRE, the static etch rate was 0.6 Angstroms/minute.

FIG. 3 shows the effect of varying the amount of the Co Cl, on the static etch rate. Without any Co Cl, the static etch rate is very high, worse than the CE slurry, at 22.8 Angstroms/minute. With increasing amounts of the Co Cl, the static etch rate drops dramatically. It should be noted that even at low amounts of the Co Cl, one fourth of the amount shown in the table for A3×above, the static etch rate is still very low, at 5.1 Angstroms/minute.

FIG. 4 shows a plot of removal rates for various materials with the A3×slurry, and varied abrasive particle sizes, from 24 nanometers to 130 nanometers. As can be seen, the removal rate for each material except for cobalt increases with particle size up to 70 nanometers, and then drops at 130 nanometers. As previously discussed, this may be because when the abrasives are larger, fewer of them are in the slurry, and less particle surface area is available for polishing. All of the removal rates here shown may be satisfactory depending on the application. The removal rate for cobalt follows the opposite trend, as it decreases with increasing particle size, before going back up at 130 nanometers.

Figure 5B:
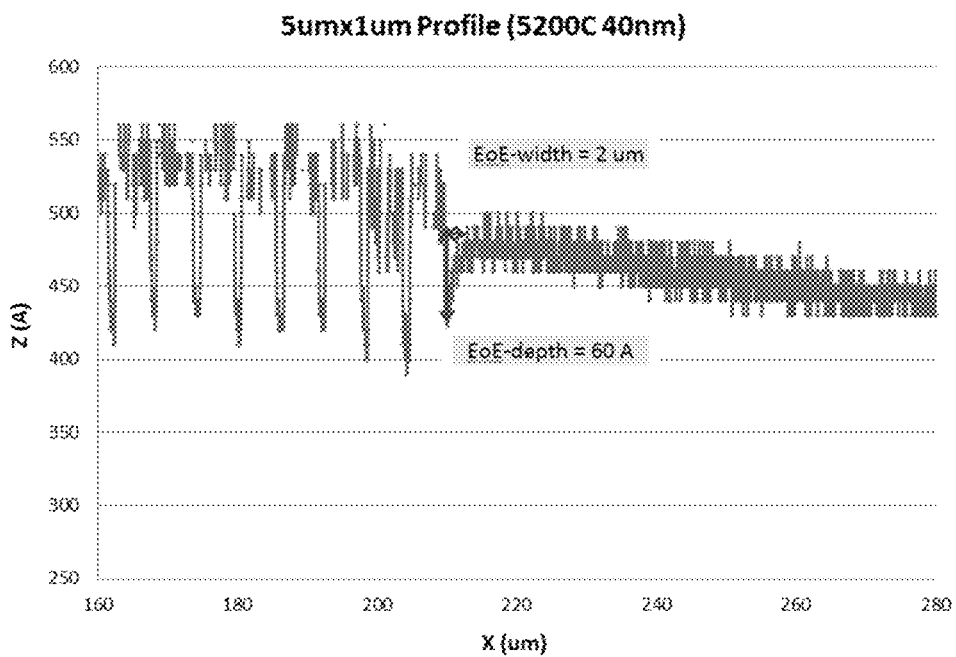

FIGS. 5a and 5b show edge of erosion (EoE) profiles for CE and A3x, respectively. As shown in FIG. 5a, the prior art slurry CE leaves a wider and deeper EoE than the slurry of the present disclosure. EoE is a measure of how precisely or cleanly a slurry manages the interface between two materials on a wafer, for example cobalt and a dielectric. Generally, the smaller the width and depth of an EoE defect, the better.

FIG. 6 shows a plot of cobalt removal rates for A3x, with varying amounts of the Co RRE, and half of the amount of Co Cl. As can be seen, and as suggested by the static etch data in FIG. 2, the higher the amount of Co RRE, the higher the removal rate of cobalt. A high removal rate of cobalt may be desirable in some applications.

FIG. 7 shows a plot of removal rates of various materials as a function of the amount of the Co Cl. As shown, even when the amount of the Co Cl in A3× is increased by a factor of 3 to 12, there is very little change in the removal rate of cobalt. As shown in FIG. 8, however, when the amount of Co Cl drops below three times the amount in A3x, and in particular below the amount shown in A3×(i.e. to 0.8× and below), the removal rate of cobalt spikes significantly.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A polishing slurry concentrate for use on cobalt substrates, comprising:
    at least one surfactant, wherein the surfactant comprises one or more phosphate groups, a six to twenty-four carbon alkyl chain, and multiple ethylene oxide groups;
    at least one azole selected from the group consisting of: a benzotriazole, a benzotriazole derivative, and a combination thereof;
    a solvent;
    a removal rate enhancer;
    an abrasive;
    a pH adjustor that is a base; and
    a chelating agent;
    wherein the composition polishes TEOS, TiN, and Ti at a faster rate than it polishes cobalt.

2. The concentrate of claim 1, wherein the surfactant is present in an amount of 10 ppm to 2000 ppm, based on the total weight of the concentrate;
    the azole is present in an amount of 20 ppm to 1%, based on the total weight of the concentrate;
    the solvent is present in an amount of 50 ppm to 4%, based on the total weight of the concentrate;
    the removal rate enhancer is present in an amount of 0.02% to 5%, based on the total weight of the concentrate;
    the abrasive is present in an amount of 2% to 24%, based on the total weight of the concentrate;
    the pH adjustor is present in an amount of 0.2% to 20%, based on the total weight of the concentrate; and
    the chelating agent is present in an amount of 0.10% to 5%, based on the total weight of the concentrate.

3. The concentrate of claim 1, wherein the surfactant is present in an amount of 15 ppm to 3000 ppm, based on the total weight of the concentrate;
    the azole is present in an amount of 30 ppm to 1.5%, based on the total weight of the concentrate;
    the solvent is present in an amount of 75 ppm to 6.0%, based on the total weight of the concentrate;
    the removal rate enhancer is present in an amount of 0.03% to 7.5%, based on the total weight of the concentrate;
    the abrasive is present in an amount of 3% to 36%, based on the total weight of the concentrate;
    the pH adjustor is present in an amount of 0.3% to 30%, based on the total weight of the concentrate; and
    the chelating agent is present in an amount of 0.15% to 7.5%, based on the total weight of the concentrate.

4. A point-of-use polishing slurry for use on cobalt substrates, comprising the concentrate of claim 1, water, and an oxidizer, so that the surfactant is present in an amount of 5 ppm to 1000 ppm, based on the total weight of the slurry;
    the azole is present in an amount of 10 ppm to 0.5%, based on the total weight of the slurry;
    the solvent is present in an amount of 25 ppm to 2.0%, based on the total weight of the slurry;
    the removal rate enhancer is present in an amount of 0.01% to 2.5%, based on the total weight of the slurry;
    the abrasive is present in an amount of 1% to 12%, based on the total weight of the slurry; the pH adjustor is present in an amount of 0.1% to 10%, based on the total weight of the slurry;

the chelating agent is present in an amount of 0.05% to 2.5%, based on the total weight of the slurry; and the oxidizer is present in an amount of 500 ppm to about 5%, based on the total weight of the POU slurry.

5. The slurry of claim 4, wherein the azole is selected from the group consisting of benzotriazole, adenine, benzimidazole, thiabendazole, tolyltriazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-Amino-4H-1,2,4-triazole, 5-methylbenzotriazole, 5-chlorobenzotriazole, 5-aminotetrazole, and combinations thereof.

6. The slurry of claim 4, wherein the solvent is selected from the group consisting of ethanol, 1-propanol, 2-propanol, n-butanol, propylene glycol, 2-methoxyethanol, 2-ethoxyethanol, propylene glycol propyl ether, ethylene glycol, and any combinations thereof.

7. The slurry of claim 4, wherein the removal rate enhancer is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, bicine, phosphoric acid, diglycolic acid, glyceric acid, tricine, alanine, histidine, valine, phenylalanine, proline, glutamine, aspartic acid, glutamic acid, glycine, arginine, lysine, tyrosine, benzoic acid, and any combinations thereof.

8. The slurry of claim 4, wherein the removal rate enhancer is an amino acid.

9. The slurry of claim 4, wherein the abrasive is silica, comprising less than 100 parts per million of alcohol, less than 100 parts per million of ammonia, and less than 100 parts per billion of an alkali metal.

10. The slurry of claim 4, wherein a size of the abrasives is from sixteen nanometers to one hundred eighty nanometers.

11. The slurry of claim 4, wherein the pH adjustor is selected from the group consisting of ammonium hydroxide, sodium hydroxide, potassium hydroxide, cesium hydroxide, monoethanol amine, diethanol amine, triethanol amine, tetrabutyl ammonium hydroxide, tetrapropylammonium hydroxide, tetraethyl ammonium hydroxide tetramethyl ammonium hydroxide, ethyltrimethylammonium hydroxide, diethyldimethylammonium hydroxide, dimethyldipropylammonium hydroxide, benzyltrimethylammonium hydroxide, and any combinations thereof.

12. The slurry of claim 4, wherein the chelating agent is selected from the group consisting of ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, propionic acid, citric acid, malonic acid, maleic acid, tartaric acid, glycolic acid, lactic acid, malic acid, oxalic acid, succinic acid, glycine, alanine, serine, and combinations thereof.

13. The slurry of claim 4, wherein the pH of the slurry is 8 or higher.

14. The slurry of claim 4, wherein the oxidizer is selected from the group consisting of hydrogen peroxide, ammonium persulfate, silver nitrate, ferric nitrates or chlorides, per acids or salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, potassium permanganate, and any combinations thereof.

15. A method of polishing a substrate that at least partially comprises cobalt, comprising the step of:
contacting the substrate with the point of use polishing slurry of claim 4.

16. A method of polishing a substrate that at least partially comprises cobalt, comprising the steps of:
diluting the concentrate of claim 1 by a factor of at least two, to form a point of use polishing slurry; and
contacting the substrate with the point of use polishing slurry.

17. A polishing slurry concentrate for use on cobalt substrates, comprising:
at least one surfactant, wherein the surfactant comprises one or more phosphate groups, a six and twenty-four carbon alkyl chains, and multiple ethylene oxide groups;
at least one azole selected from the group consisting of: a benzotriazole, a benzotriazole derivative, and a combination thereof;
a solvent;
a removal rate enhancer;
an abrasive;
a pH adjustor that is a base; and
a chelating agent selected from the group consisting of ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, propionic acid, citric acid, malonic acid, maleic acid, tartaric acid, glycolic acid, lactic acid, malic acid, oxalic acid, succinic acid, and combinations thereof.

* * * * *